(12) United States Patent
Zeng

(10) Patent No.: US 12,738,729 B2
(45) Date of Patent: Sep. 15, 2026

(54) DISPLAY MODULE WITH ELECTROSTATIC DISCHARGE PROTECTION AND DISPLAY DEVICE

(71) Applicant: Hefei Visionox Technology Co., Ltd., Hefei (CN)

(72) Inventor: Wenyu Zeng, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 0 days.

(21) Appl. No.: 19/056,762

(22) Filed: Feb. 19, 2025

(65) Prior Publication Data

US 2025/0192544 A1 Jun. 12, 2025

Related U.S. Application Data

(63) Continuation of application No. PCT/CN2024/088730, filed on Apr. 19, 2024.

(30) Foreign Application Priority Data

Jul. 31, 2023 (CN) ......................... 202310966949.6

(51) Int. Cl.
*H02H 9/02* (2006.01)
*G09G 3/20* (2006.01)
*H10W 90/00* (2026.01)

(52) U.S. Cl.
CPC ................. *H02H 9/02* (2013.01); *G09G 3/20* (2013.01); *H10W 90/701* (2026.01); *G09G 2330/04* (2013.01)

(58) Field of Classification Search
None
See application file for complete search history.

(56) References Cited

U.S. PATENT DOCUMENTS

2009/0225092 A1* 9/2009 Baek .................... G09G 3/3685 455/566
2012/0320301 A1 12/2012 Shin et al.
(Continued)

FOREIGN PATENT DOCUMENTS

CN 1963600 A 5/2007
CN 102495505 A 6/2012
(Continued)

OTHER PUBLICATIONS

Espacenet translation of CN113160729A (Year: 2021).*
(Continued)

*Primary Examiner* — Donna V Bocar
(74) *Attorney, Agent, or Firm* — Kilpatrick Townsend & Stockton LLP

(57) ABSTRACT

Provided are a display module and a display device. The display module includes a display screen and a driver chip. The display screen includes a display region and a non-display region. The driver chip is disposed in the non-display region of the display screen and configured to at least generate a drive signal that drives the display screen. The driver chip includes at least one first pin and at least one second pin, the drive signal generated by the driver chip is related to a signal transmitted by the at least one first pin, and the drive signal generated by the driver chip is unrelated to a signal transmitted by the at least one second pin. At least one of the at least one first pin is electrically connected to at least one of the at least one second pin.

16 Claims, 8 Drawing Sheets

(56) References Cited

U.S. PATENT DOCUMENTS

2021/0335163 A1* 10/2021 Zou ...................... H05K 1/0259
2021/0366330 A1 11/2021 Huang et al.
2022/0036848 A1* 2/2022 Chen ................. G02F 1/133514

FOREIGN PATENT DOCUMENTS

CN 108335634 A 7/2018
CN 110827688 A 2/2020
CN 111863885 A 10/2020
CN 113160729 A * 7/2021 ............... G09G 3/36
CN 113359332 A 9/2021
CN 114783339 A 7/2022
CN 116847525 A 10/2023
JP H09244051 A 9/1997
JP H11233777 A 8/1999
JP 2010108981 A 5/2010
TW 200723967 A 6/2007

OTHER PUBLICATIONS

Chinese First Office Action Issued in Chinese Patent Application No. 202310966949.6.
International Search Report of Application No. PCT/CN2024/088730.

* cited by examiner

DISPLAY MODULE WITH ELECTROSTATIC DISCHARGE PROTECTION AND DISPLAY DEVICE

CROSS-REFERENCE TO RELATED APPLICATION(S)

This application is a continuation of International Patent Application No. PCT/CN2024/088730, filed on Apr. 19, 2024, which claims priority to Chinese Patent Application No. 202310966949.6 filed on Jul. 31, 2023, disclosures of both of which are incorporated herein by reference in their entireties.

FIELD

Embodiments of the present application relate to the field of display technologies, for example, a display module and a display device.

BACKGROUND

With the development of display technologies, the requirement on the electrostatic protection capability of a display device is increasingly high.

During an electrostatic test on the display device or the use of the display device, static electricity may be introduced to a pin of a driver chip. When the static electricity exceeds the load of an electrostatic protection circuit of the pin of the driver chip, the pin of the driver chip and a related line connected to the pin of the driver chip may be damaged. However, if a key pin of the driver chip and a related line connected to the key pin of the driver chip are damaged, the display performance of a display module or the touch performance of the display module will be significantly affected.

SUMMARY

The present application provides a display module and a display device to improve the electrostatic protection capability of the display module and the electrostatic protection capability of the display device, reduce the risk that key pins of a driver chip and related lines connected to the key pins are damaged, and ensure good display performance and good touch performance.

In some embodiments of the present application provide a display module.

The display module includes a display screen and a driver chip. The display screen includes a display region and a non-display region. The driver chip is disposed in the non-display region of the display screen and configured to at least generate a drive signal that drives the display screen. The driver chip includes at least one first pin and at least one second pin, the drive signal generated by the driver chip is related to a signal transmitted by the at least one first pin, and the drive signal generated by the driver chip is unrelated to a signal transmitted by the at least one second pin. At least one of the at least one first pin is electrically connected to at least one of the at least one second pin.

In some embodiments of the present application further provide a display device. The display device includes the display module in the embodiments.

The display module and the display device in the embodiments of the present application include the display screen and the driver chip. The driver chip includes the at least one first pin and the at least one second pin, the drive signal generated by the driver chip is related to the signal transmitted by the at least one first pin, and the drive signal of the display screen generated by the driver chip is unrelated to the signal transmitted by the at least one second pin. The at least one of the at least one first pin is electrically connected to the at least one of the at least one second pin, causing an electrostatic protection circuit connected to the at least one first pin and an electrostatic protection circuit connected to the at least one second pin to jointly withstand an intrusive electrostatic load. Thus, the risk is reduced that the at least one first pin and a related line connected to the at least one first pin are damaged, the electrostatic protection capability of the display module is improved, and the reliability is ensured with which the at least one first pin transmits the signal. Further, the reliability of the drive signal of the display screen generated by the driver chip is improved, to ensure the display performance of the display module and the touch performance of the display module.

DETAILED DESCRIPTION

As described in the background, a display device is less capable of electrostatic protection. A key pin of a driver chip and a related line connected to the key pin are easily damaged, and the display performance of a display module or the touch performance of the display module is affected. Through researches, the inventor finds that a reason for the preceding problem is that the driver chip is connected to a flexible circuit board through the key pin and the flexible circuit board is connected to a mainboard in the display device. The flexible circuit board can transmit a signal received from the mainboard to the key pin of the driver chip. Thus, the driver chip generates a drive signal according to the signal received by the key pin of the driver chip and sends the drive signal to a display screen, and the display screen is driven by the drive signal to work (including a display and a touch). In the related art, during an electrostatic test on the display module, static electricity is applied to a connector connected to the flexible circuit board and reaches the key pin of the driver chip through the flexible circuit board. When the static electricity exceeds the load that can be withstood by an electrostatic protection circuit of the key pin of the driver chip, the key pin and the related line connected to the key pin may be damaged, and the key pin is caused to be incapable of receiving the signal transmitted from the flexible circuit board. Therefore, the drive signal generated by the driver chip is affected, finally resulting in that the display performance of the display module or the touch performance of the display module is affected. During the transportation and use of the display device, the static electricity is also inevitably introduced. Based on the same reason, the display performance of the display device and the touch performance of the display device are also affected.

Figure 1:
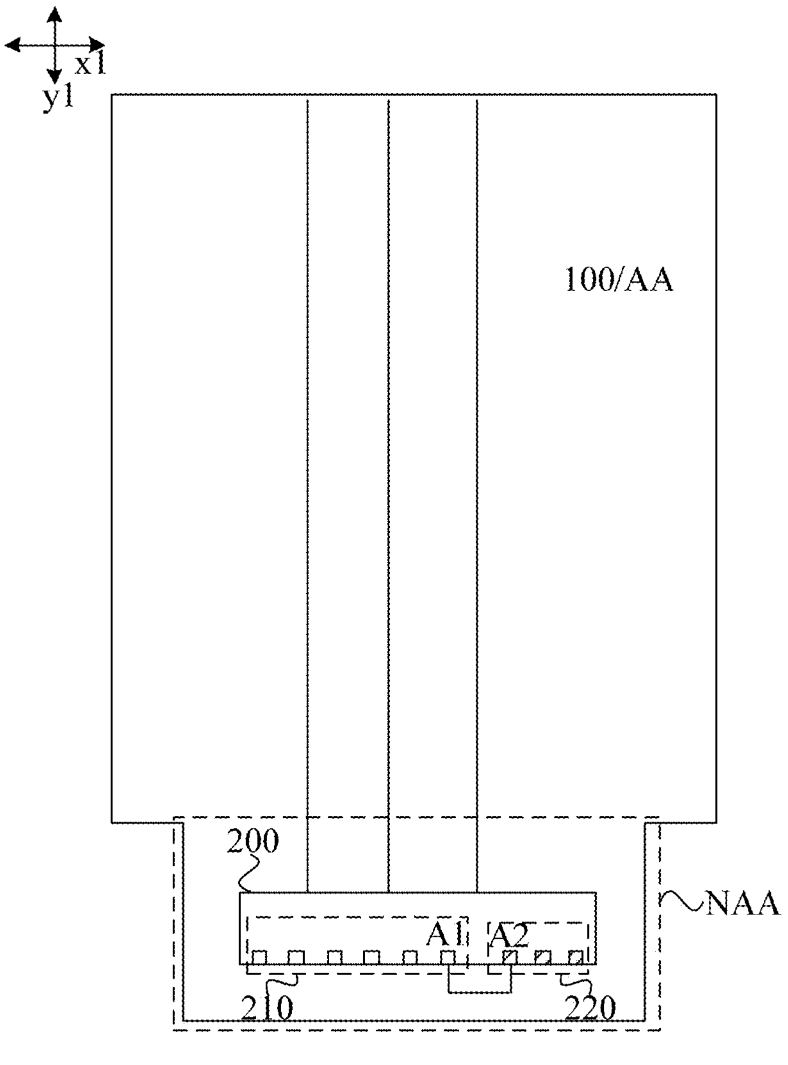
FIG. 1 is a structural diagram of a display module according to an embodiment of the present application.

Based on the preceding reasons, embodiments of the present application provide a display module. FIG. 1 is a structural diagram of a display module according to an embodiment of the present application. Referring to FIG. 1, the display module includes a display screen 100 and a driver chip 200. The display screen includes a display region AA and a non-display region NAA. The driver chip 200 is disposed in the non-display region NAA of the display screen 100 and configured to at least generate a drive signal that drives the display screen. The driver chip 200 includes at least one first pin A1 and at least one second pin A2. The drive signal generated by the driver chip 200 is related to a signal transmitted by the at least one first pin A1. The drive signal generated by the driver chip 200 is unrelated to a signal transmitted by the at least one second pin A2. At least one of the at least one first pin A1 is electrically connected to one second pin A2.

In one embodiment, the display screen 100 may be an organic light-emitting diode display screen, a liquid crystal display screen, a micro light-emitting diode display screen, or another type of display screen. The type of the display screen 100 is not limited here in this embodiment. The display screen 100 may include a driver circuit layer and a display function layer. The driver circuit layer includes a display driver circuit that drives the display function layer to perform a display. For example, when the display screen 100 is the organic light-emitting diode display screen, the display function layer includes an organic light-emitting diode. In some embodiments of the present application, the display screen 100 may further include a touch function layer to implement the touch function of a display device. When the display screen 100 includes the touch function layer, the driver circuit layer includes touch-related devices and touch-related lines.

The drive signal generated by the driver chip 200 is related to the signal transmitted by the first pin A1, which refers to that the drive signal generated by the driver chip 200 varies with the variation of the signal transmitted by the at least one first pin A1. For example, an implementation manner of the drive signal may be that the driver chip 200 is connected to the mainboard of the display device and the display screen 100 of the display device and the driver chip 200 may receive a mainboard output signal and generate the drive signal of the display screen 100 according to the mainboard output signal. The mainboard output signal may include a power signal required by a digital circuit, a Mobile Industry Processor Interface (MIPI) data signal, and the like. The drive signal includes a display drive signal and a touch drive signal. The display drive signal includes a clock signal, a high-level signal, a low-level signal, and a start signal and the clock signal, the high-level signal, the low-level signal and a start signal are required by a gate driving circuit on the display screen 100. The display drive signal further includes a data voltage signal required by a pixel circuit. The touch drive signal includes a touch detection signal that may be a touch detection voltage. The driver chip 200 includes multiple first pins A1. The driver chip 200 is electrically connected to the mainboard through the first pins A1 or is connected to a circuit device on the flexible circuit board through the first pins A1. After the mainboard output signal is transmitted to a first pin A1, the driver chip 200 generates the drive signal according to the mainboard output signal received by the first pin A1. Therefore, the drive signal generated by the driver chip 200 is related to the signal transmitted by the first pin A1.

The driver chip 200 further includes second pins A2. The second pins A2 are pins transmitting signals that are unrelated to the drive signal of the display screen 100 generated by the driver chip 200. The drive signal generated by the driver chip 200 is unrelated to the signals transmitted by the second pins A2, and "unrelated" refers to that the drive signal generated by the chip has no relation to the signals transmitted by the second pins A2. A transmission line of each of the first pins A1 and a transmission line of each of the second pins A2 are independent of each other. For example, the second pins A2 may be non-enabled pins reserved on the driver chip 200. The reserved non-enabled pins are classified into at least two types. A first type of non-enabled pins refer to pins reserved to ensure that the driver chip 200 is applicable to different types of display screens 100. In one embodiment, to ensure that the driver chip 200 is applicable to the different types of display screens 100, the pins disposed on the driver chip 200 cover pins allowing the driver chip 200 to be applied to multiple types of display screens 100. Therefore, when the driver chip 200 is applied to a certain type of display screens 100, some of the pins need not be used. The pins that need not be used are regarded as the second pins A2. A second type of non-enabled pins refer to pins that need to be used in a mode where the driver chip 200 is debugged. After the display device is delivered from a factory, the pins for debugging need not be used and therefore may also be regarded as the second pins A2.

The driver chip 200 includes multiple electrostatic protection circuits. Each first pin A1 is electrically connected to one electrostatic protection circuit correspondingly, and each second pin A2 is electrically connected to one electrostatic protection circuit correspondingly. The electrical connection refers to that two endpoints are electrically connected to each other through a wire.

In the related art, the second pins A2 are not electrically connected to the mainboard, and the first pins A1 are electrically connected to the mainboard. In one embodiment, the first pins A1 are connected to the flexible circuit board, the flexible circuit board is connected to a connector, and the connector is connected to the mainboard and the first pins A1 are electrically connected to the mainboard. During an electrostatic test, static electricity needs to be applied from the connector to the display module. The static electricity is transmitted to the first pins A1 of the driver chip 200 along conductive lines and the like. The first pins A1 are connected to corresponding electrostatic protection circuits. When the static electricity is excessively high and exceeds the range that can be withstood by each of the electrostatic protection circuits connected to the first pins A1, the first pins A1 or related lines connected to the first pins A1 are damaged. In this embodiment, the first pins A1 are electrically connected to the second pins A2 and electrostatic energy originally all reaching the first pins A1 can partially reach the second pins A2. Thus, the electrostatic protection circuits connected to the first pins A1 and electrostatic protection circuits connected to the second pins A2 jointly withstand an intrusive electrostatic load and the electrostatic energy withstood by the first pins A1 is reduced, to reduce the risk that the first pins A1 and the related lines connected to the first pins A1 are damaged. In one embodiment, the drive signal of the display screen 100 generated by the driver chip 200 is unrelated to the signals transmitted by the second pins A2. Therefore, the static electricity conducted to the second pins A2 does not affect the display performance of the display module or the touch performance of the display module. When the static electricity is introduced during the transportation and use of the display device, the risk is also reduced, based on the same reason, that the first pins A1 and the related lines connected to the first pins A1 are damaged. The details are not repeated here.

In this embodiment, at least one first pin A1 is electrically connected to at least one second pin A2. In one embodiment, because the number of second pins A2 is limited, only part of the multiple first pins A1 may be electrically connected to the second pin A2 in this embodiment. In particular, key pins among the multiple first pins A1 may be selected to be electrically connected to the second pins A2. The key pins may include a pin transmitting the power signal required by the digital circuit and a pin transmitting the MIPI data signal. It is to be noted that when sufficient second pins A2 are provided, each first pin A1 may be electrically connected to a second pin A2, to reduce the risk that each first pin A1 and a related line electrically connected to each first pin A1 are broken down by the static electricity.

The display module in this embodiment includes the display screen and the driver chip. The driver chip includes the first pins and the second pins, the drive signal generated by the driver chip is related to the signals transmitted by the first pins, and the drive signal of the display screen generated by the driver chip is unrelated to the signals transmitted by the second pins. The at least one first pin is electrically connected to the at least one second pin, causing the electrostatic protection circuits connected to the first pins and the electrostatic protection circuits connected to the second pins to jointly withstand the intrusive electrostatic load. Thus, the risk is reduced that the first pins and the related lines connected to the first pins are damaged, the electrostatic protection capability of the display module is improved, and the reliability is ensured with which the first pins transmit the signals. Further, the reliability of the drive signal of the display screen generated by the driver chip is improved, to ensure the display performance of the display module and the touch performance of the display module.

Figure 2:
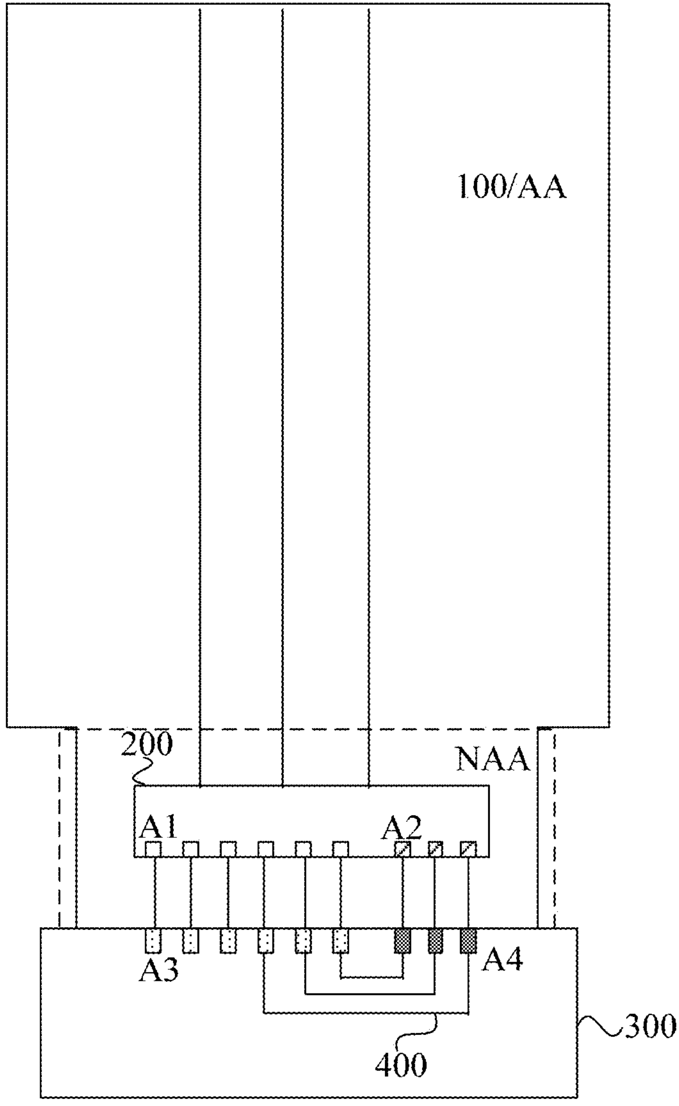
FIG. 2 is a structural diagram of another display module according to an embodiment of the present application.

FIG. 2 is a structural diagram of another display module according to an embodiment of the present application. Referring to FIG. 2, in one embodiment, the display module further includes a flexible circuit board 300 including at least one third pin A3 and at least one fourth pin A4. The at least one third pin A3 is electrically connected to the at least one first pin A1, and the at least one fourth pin A4 is electrically connected to the at least one second pin A2. The flexible circuit board 300 further includes connection lines. Third pins A3 are electrically connected to fourth pins A4 through the connection lines 400 to cause first pins A1 electrically connected to the third pins A3 to be electrically connected to second pins A2 electrically connected to the fourth pins A4.

In one embodiment, the flexible circuit board 300 is bonded in the non-display region NAA of the display screen 100 and provided with pins connected to pins of the driver chip 200 in a one-to-one correspondence. The flexible circuit board 300 is further electrically connected to the mainboard and the flexible circuit board 300 can receive the mainboard output signal from the mainboard and transmit the mainboard output signal to the driver chip 200. The pins of the flexible circuit board 300 include the third pins A3 and the fourth pins A4. The third pins A3 are electrically connected to the first pins A1 of the driver chip 200 in a one-to-one correspondence and the mainboard output signal received from the mainboard can be transmitted to the first pins A1 of the driver chip 200. The fourth pins A4 are electrically connected to the second pins A2 of the driver chip 200 and signals of the fourth pins A4 of the flexible circuit board 300 can be transmitted to the second pins A2 of the driver chip 200. In this embodiment, the flexible circuit board 300 includes the connection lines 400. The connection lines 400 may electrically connect the third pins A3 to the fourth pins A4 and the first pins A1 electrically connected to the third pins A3 can be electrically connected to the second pins A2 electrically connected to the fourth pins A4. That is, the connection lines 400 are disposed on the flexible circuit board 300 to implement the electrical connections between the first pins A1 of the driver chip 200 and the second pins A2 of the driver chip 200. Thus, when the static electricity intrudes into the driver chip 200 from the flexible circuit board 300, the electrostatic protection circuits connected to the first pins A1 and the electrostatic protection circuits connected to the second pins A2 jointly withstand the intrusive electrostatic load, to reduce the risk that the first pins A1 and the related lines connected to the first pins A1 are damaged. In addition, the connections between the first pins A1 and the second pins A2 are implemented on the flexible circuit board 300. When the second pins A2 of the driver chip 200 need to be enabled, only the flexible circuit board 300 of the display module needs to be unbound from the display screen 100. Then, the display screen 100 is connected to another flexible circuit board 300 or a circuit device. The structure of the display screen 100 need not be changed. Therefore, during the manufacture of the display screen 100, only the original mask step needs to be retained. No additional process step is performed to prepare the display module.

Figure 3:
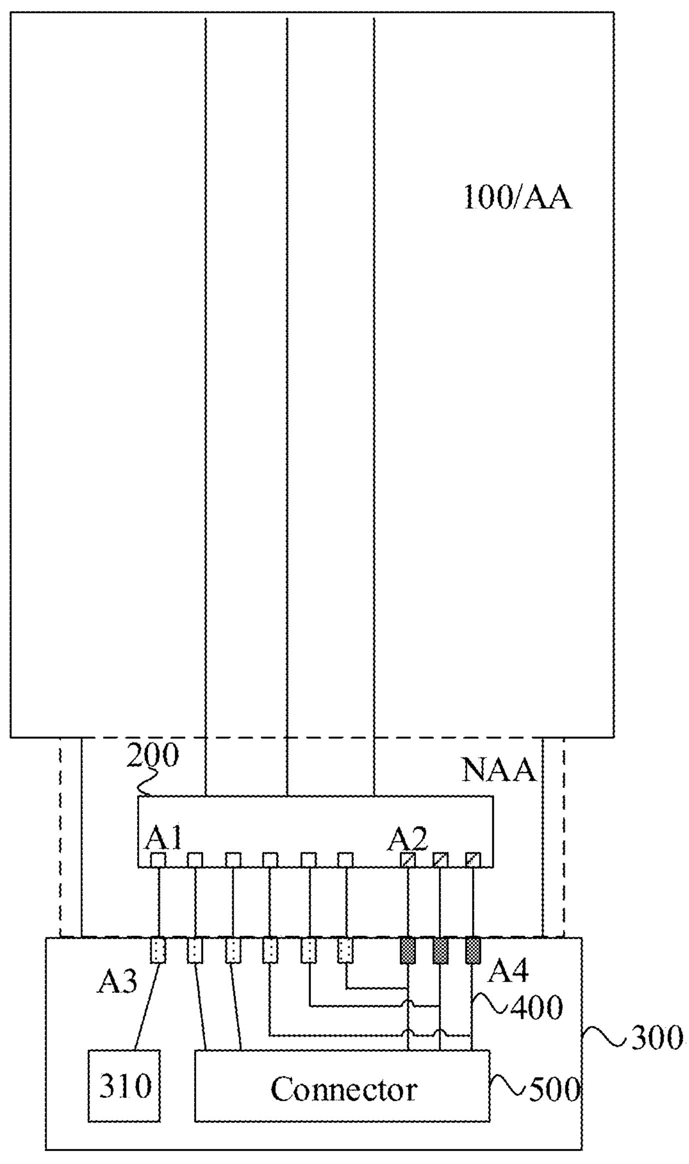
FIG. 3 is a structural diagram of another display module according to an embodiment of the present application.
Figure 4:
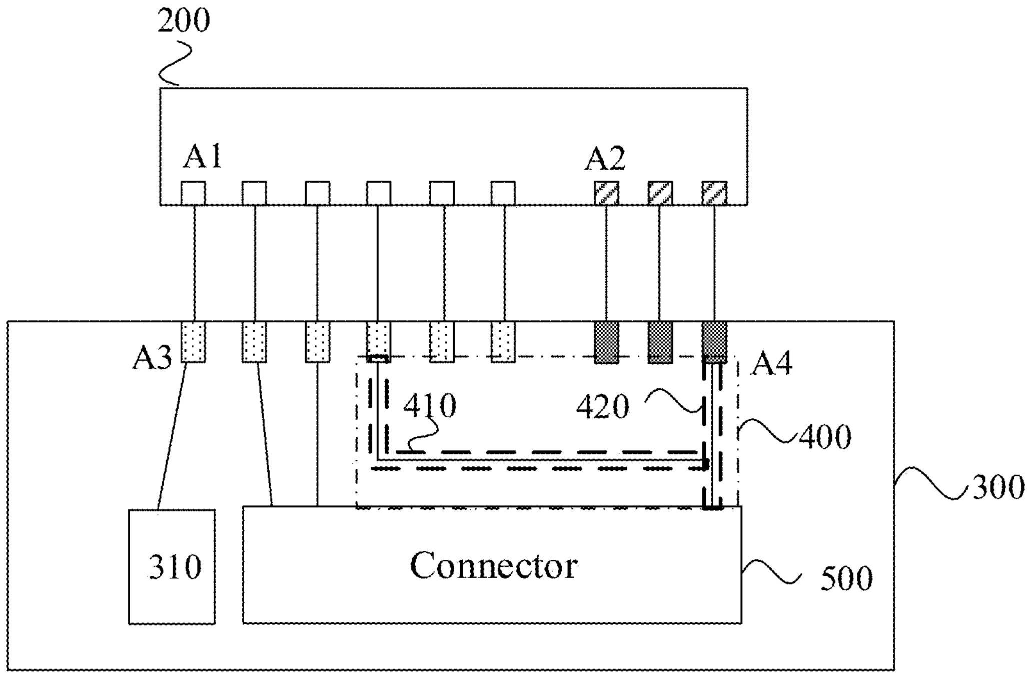
FIG. 4 is a specific structural diagram showing that a connector in FIG. 3 is connected to a third pin and a fourth pin through a connection line.

FIG. 3 is a structural diagram of another display module according to an embodiment of the present application. FIG. 4 is a specific structural diagram showing that a connector in FIG. 3 is connected to a third pin and a fourth pin through a connection line. To clearly show the structure of each of the connection lines 400, the structure of only one connection line 400 is used as an example in FIG. 4. Referring to FIGS. 3 and 4, in one embodiment, the display module further includes the connector 500 including multiple connection ports. The connection line 400 includes a first connection segment 410 and a second connection segment 420. A first terminal of the first connection segment 410 and a first terminal of the second connection segment 420 are electrically connected to the same connection port. A second terminal of the first connection segment 410 is electrically connected to the third pin A3. A second terminal of the second connection segment 420 is electrically connected to the fourth pin A4. The line width of the second connection segment 420 is greater than the line width of the first connection segment 410; and/or the line length of the second connection segment 420 is less than the line length of the first connection segment 410.

The connector 500 may further include multiple input ports. The input ports are connected to the mainboard of the display device. The connection ports of the connector 500 are connected to the pins of the flexible circuit board 300 (the pins of the flexible circuit board 300 include the third pins A3 and the fourth pins A4). The pins of the flexible circuit board 300 are connected to the pins of the driver chip 200 (the pins of the driver chip 200 include the first pins A1 and the second pins A2). Thus, the electrical connection between the mainboard and the driver chip 200 can be implemented. A device region 310 is further disposed on the flexible circuit board 300. A circuit device is disposed in the device region 310. According to an actual requirement of the driver chip 200, part of the first pins A1 may be connected to the circuit device in the device region 310.

In one embodiment, the line width of the second connection segment 420 is greater than the line width of the first connection segment 410 and a transfer speed of a charge in the second connection segment 420 is higher than a transfer speed of a charge in the first connection segment 410. The conduction of more electrostatic energy to the second pin A2 is facilitated. Thus, the electrostatic energy reaching the first pin A1 is further reduced, to further reduce the risk that the first pin A1 and a related line connected to the first pin A1 are damaged. In one embodiment, the drive signal of the display screen 100 generated by the driver chip 200 is unrelated to a signal transmitted by the second pin A2. Even if the second pin A2 and a related line connected to the second pin A2 are damaged by the static electricity because of withstanding an excessive electrostatic load, the display performance of the display module and the touch performance of the display module are not affected.

The line length of the second connection segment 420 is less than the line length of the first connection segment 410 and the time during which a charge is outputted from the connection port of the connector 500 to the fourth pin A4 can be shorter than the time during which a charge is simultaneously outputted from the same connection port of the connector 500 to be at the third pin A3. The conduction of more electrostatic energy to the second pin A2 is facilitated. Thus, the electrostatic energy reaching the first pin A1 is further reduced, to further reduce the risk that the first pin A1 and the related line connected to the first pin A1 are damaged. In one embodiment, the drive signal of the display screen 100 generated by the driver chip 200 is unrelated to the signal transmitted by the second pin A2. Even if the second pin A2 and the related line connected to the second pin A2 are damaged by the static electricity because of withstanding the excessive electrostatic load, the display performance of the display module and the touch performance of the display module are not affected.

Figure 5:
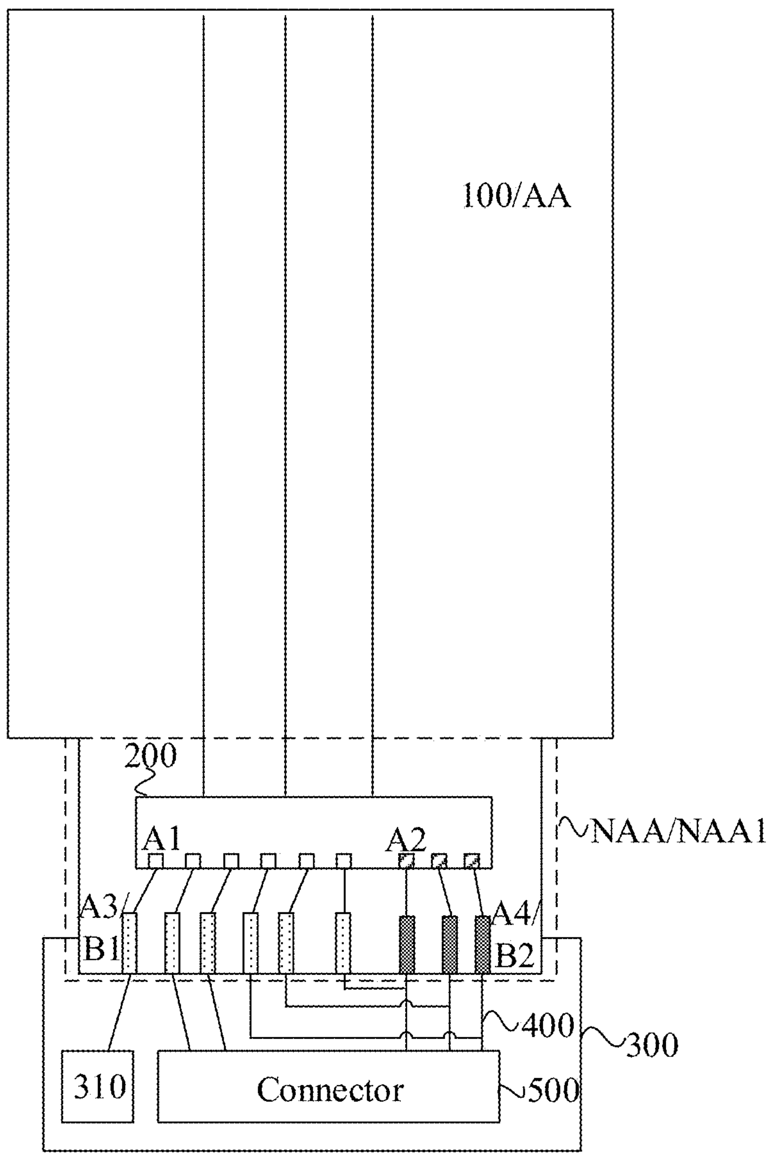
FIG. 5 is a structural diagram of another display module according to an embodiment of the present application.

FIG. 5 is a structural diagram of another display module according to an embodiment of the present application. Referring to FIG. 5, in one embodiment, the non-display region NAA includes a bonding region NAA1. First bonding terminals B1 electrically connected to the first pins A1 and second bonding terminals B2 electrically connected to the second pins A2 are disposed in the bonding region NAA1. The third pins A3 are electrically connected to the first bonding terminals B1, and the fourth pins A4 are electrically connected to the second bonding terminals B2.

In one embodiment, both the first pins A1 of the driver chip 200 and the second pins A2 of the driver chip 200 may be connected to the corresponding first bonding terminals B1 and the corresponding second bonding terminals B2 through lines on the display screen 100. The third pins A3 of the flexible circuit board 300 may be electrically connected to the first bonding terminals B1 through crimping or a conductive adhesive. The fourth pins A4 of the flexible circuit board 300 may be electrically connected to the second bonding terminals B2 through the crimping or the conductive adhesive.

Figure 6:
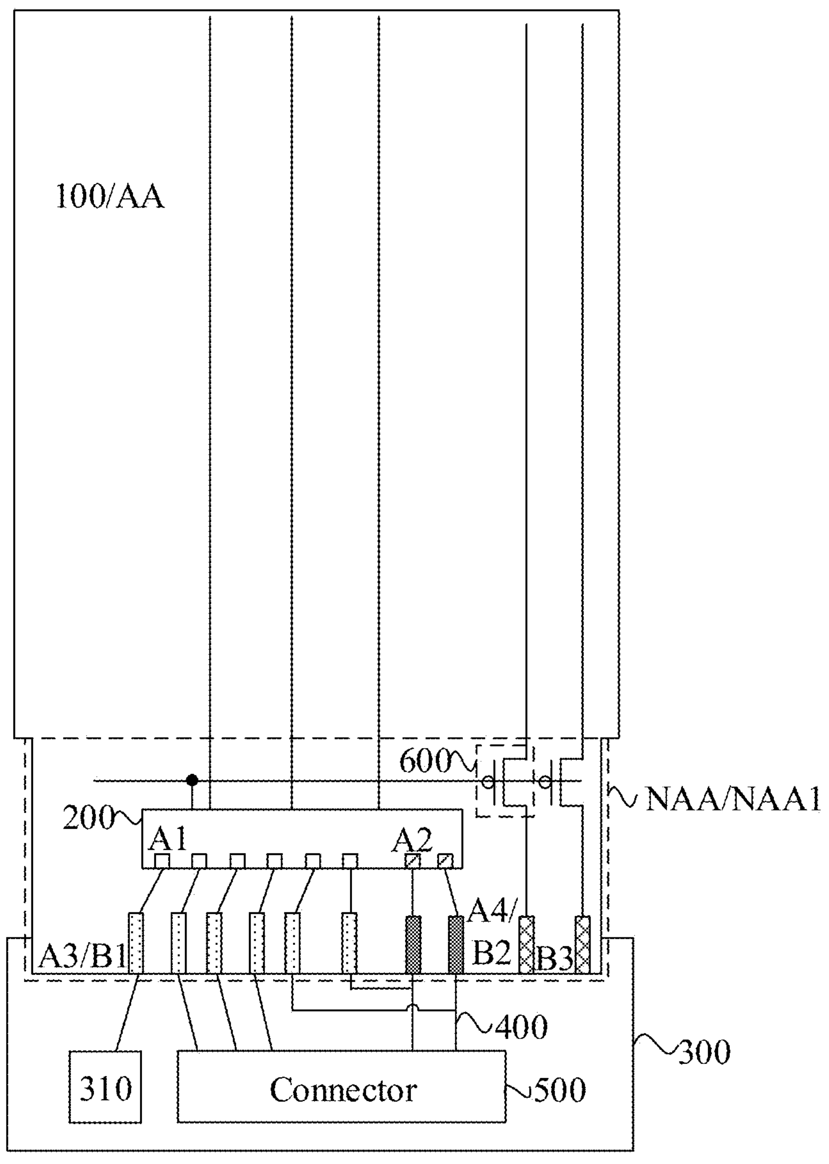
FIG. 6 is a structural diagram of another display module according to an embodiment of the present application.

FIG. 6 is a structural diagram of another display module according to an embodiment of the present application. Referring to FIG. 6, in one embodiment, the non-display region NAA includes the bonding region NAA1. Third bonding terminals B3 are disposed in the bonding region NAA1. The third bonding terminals B3 are test pins of a display screen test circuit on the display screen 100. The test pins are configured to receive test data signals when the display screen 100 is tested. At least one of the first pins A1 is electrically connected to at least one of the third bonding terminals B3.

In one embodiment, before the display screen 100 is bonded with the driver chip 200 and the flexible circuit board 300, the display screen 100 needs to be tested. When the display screen 100 is tested, a test signal is generally inputted to the display screen 100 through probe contact to test the display screen 100. When the display screen 100 is tested, the third bonding terminals B3 are electrically connected to circuit structures in the display region AA of the display screen 100. The third bonding terminals B3 are electrically connected through the probe contact to transmit the test data signals to the circuit structures in the display region AA of the display screen 100. After the display module is bonded to the driver chip 200 and the flexible circuit board 300, the third bonding terminals B3 are electrically disconnected from the circuit structures in the display region AA of the display screen 100 and cannot transmit the signals to the circuit structures in the display region AA of the display screen 100. Therefore, after the display device is delivered from the factory, the drive signal of the display screen 100 is unrelated to the signals transmitted by the third bonding terminals B3. In this embodiment, the at least one of the first pins A1 of the driver chip 200 is electrically connected to the third bonding terminals B3. Thus, an electrostatic protection circuit connected to the first pin A1 and electrostatic protection circuits connected to the third bonding terminals B3 jointly withstand the intrusive electrostatic load and the electrostatic energy withstood by the first pin A1 is reduced, to reduce the risk that the first pin A1 and the related line connected to the first pin A1 are damaged. In one embodiment, the drive signal of the display screen 100 generated by the driver chip 200 is unrelated to the signals transmitted by the third bonding terminals B3. Therefore, the static electricity conducted to the third bonding terminals B3 does not affect the display performance of the display module or the touch performance of the display module. Because the number of second pins A2 of the driver chip 200 is limited, part of the pins of the driver chip 200 are configured to be electrically connected to the third bonding terminals B3 and more first pins A1 may be connected to the pins unrelated to the drive signal of the display screen 100 outputted by the driver chip 200. Thus, the electrostatic load withstood by the more first pins A1 is reduced, to further improve the electrostatic protection capability of the display module. In some embodiments of the present application, the first pins A1 may be connected to the second pins A2 and the third bonding terminals B3 simultaneously, to further reduce the risk that the first pins A1 and the related lines connected to the first pins A1 are damaged.

With continued reference to FIG. 6, to control the states of the electrical connections between the test pins and the circuit structures in the display region of the display screen 100, in one embodiment, the display screen 100 is configured to include control switches 600 electrically connected to the test pins in a one-to-one correspondence. Control terminals of the control switches 600 are electrically connected to the driver chip 200. First terminals of the control switches 600 are electrically connected to the corresponding test pins, and second terminals of the control switches 600 are connected to drive signal lines in the display screen 100. The driver chip 200 is configured to control the control switches 600 to be off when the display screen 100 works.

In one embodiment, during the test on the display screen 100 before the display screen 100 is bonded to the driver chip 200, the control terminals of the control switches 600 may be connected through the probe contact and turn-on control signals are provided for the control terminals of the control switches 600, causing the control switches 600 to be on. The first terminals of the control switch 600 receive the test data signals through the probe contact and further transmit the test data signals to the second terminals of the control switches 600. Thus, the test data signals are transmitted to the drive signal lines and transmitted to the circuit structures in the display region through the drive signal lines and the display screen 100 is tested. After the test on the display screen 100 is completed and the display screen 100 is bonded to the driver chip 200, the driver chip 200 is electrically connected to the control terminals of the control switches 600. When the display screen 100 works, for example, the display screen 100 performs the display and/or the touch, the driver chip 200 sends turn-off control signals to the control switches 600, causing the control switches 600 to be off. Further, when the test pins are connected to the first pins A1 and share the electrostatic energy withstood by the first pins A1, the display performance of the display screen 100 and the touch performance of the display screen 100 are not affected.

In one embodiment, the display screen test circuit may be a display screen lighting test circuit (that is, a screen lighting test circuit) or a display screen touch test circuit. When the display screen test circuit is the display screen lighting test circuit, the drive signal lines are data lines, and the test data signals are data voltages. When the display screen test circuit is the display screen touch test circuit, the drive signal lines are touch signal lines, and the test data signals are touch detection voltages.

When the multiple first pins A1 are electrically connected to the third bonding terminals B3, third bonding terminals B3 connected to different first pins A1 are different, that is, the first pins A1 are electrically connected to the third bonding terminals B3 in a one-to-one correspondence. In this manner, signals transmitted by the different first pins A1 can be prevented from affecting each other, to ensure that the driver chip 200 works normally.

With continued reference to FIG. 1, based on the preceding embodiments, the first pins A1 are disposed in a first region 210 of the driver chip 200, and the second pins A2 are disposed in a second region 220 of the driver chip 200. The direction of the line connecting the first region 210 to the second region 220 is a first direction x1. The first direction x1 is perpendicular to a second direction y1. The second direction y1 is the direction of the line connecting the driver chip 200 to the display screen 100.

In one embodiment, the first pins A1 are disposed in the same region, the second pins A2 are disposed in the same region, and the first pins A1 and the second pins A2 are disposed in different regions. Thus, after the driver chip 200 is connected to the flexible circuit board 300, signal lines (denoted as transmission signal lines below) on the flexible circuit board 300 that connect the first pins A1 to the mainboard are also relatively aggregated and signal lines connected to the second pins A2 are introduced as few as possible between the transmission signal lines. Wiring is relatively easy to implement, and signals transmitted by the transmission signal lines are less affected.

Figure 7:
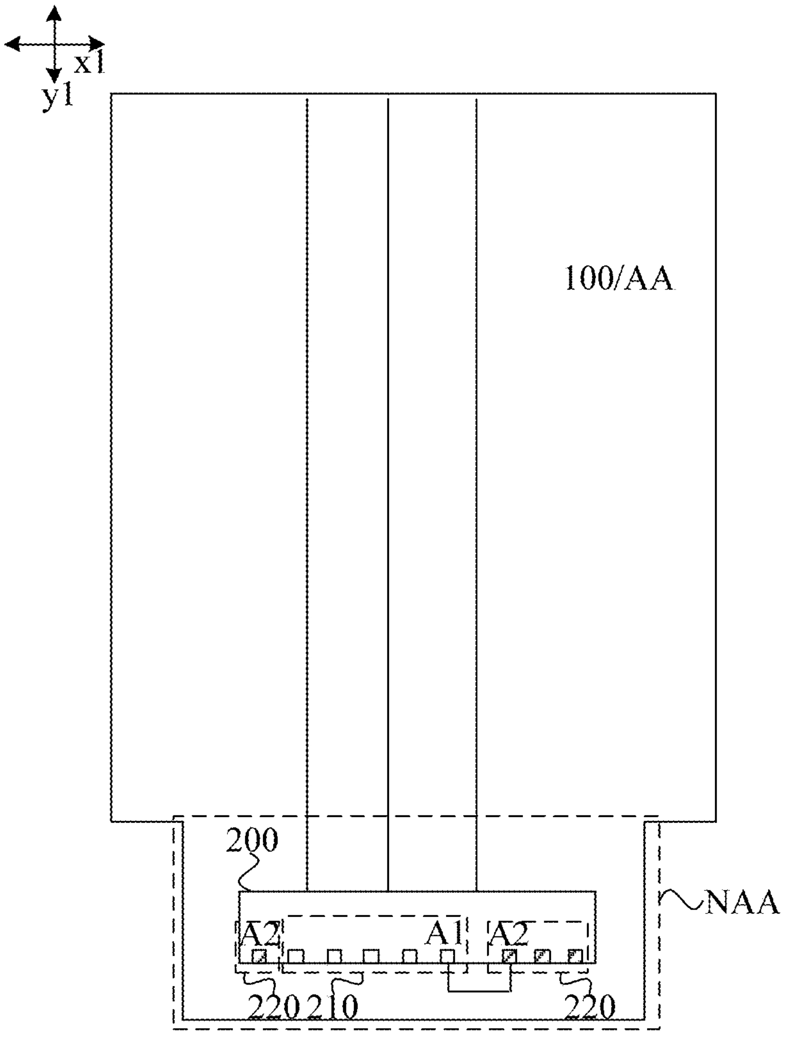
FIG. 7 is a structural diagram of another display module according to an embodiment of the present application.

FIG. 7 is a structural diagram of another display module according to an embodiment of the present application. Referring to FIG. 7, in one embodiment, the driver chip 200 includes two second regions 220, and the first region 210 is disposed between the two second regions 220. In this manner, the first pins A1 can be in a relatively middle region of the driver chip 200 in the first direction x1 and fewer signal lines connected to the second pins A2 are introduced between the transmission signal lines, and the wiring is easier to implement.

Based on the preceding embodiments, when the multiple first pins A1 are electrically connected to the multiple second pins A2, second pins A2 electrically connected to different first pins A1 are different. In this manner, it can be ensured that the different first pins A1 are not electrically connected to each other to prevent signals transmitted by the first pins A1 for transmitting the different signals from affecting each other. It is ensured that the driver chip 200 works normally, to ensure good display performance of the display screen 100 and good touch performance of the display screen 100.

Based on the preceding embodiments, the at least one first pin A1 is electrically connected to multiple second pins A2. In this manner, the electrostatic energy originally all reaching the first pins A1 can be jointly withstood by more second pins A2 and the first pins A1 and the electrostatic load withstood by the first pins A1 is further reduced. Thus, the risk is further reduced that the first pins A1 and the related lines connected to the first pins A1 are damaged.

Figure 8:
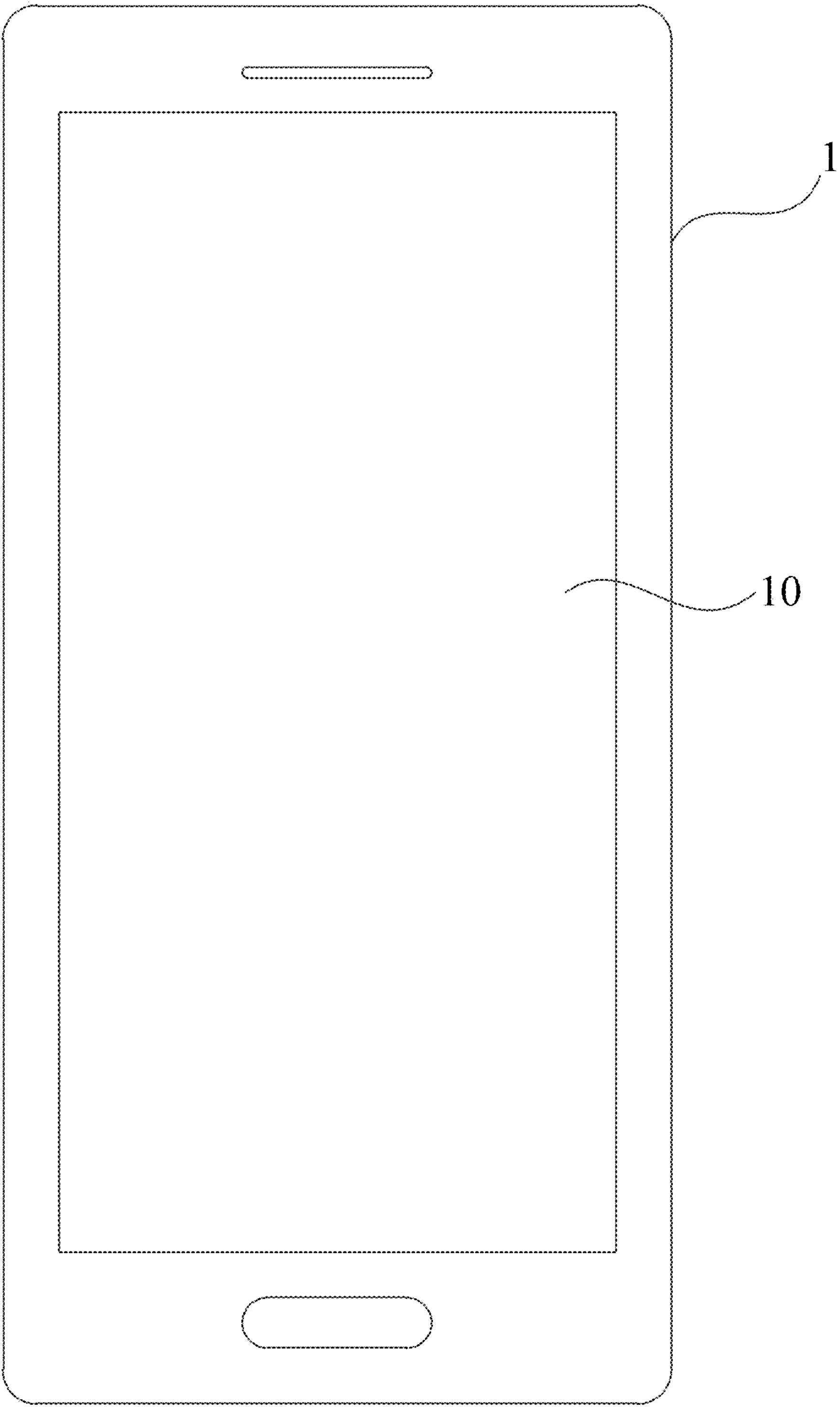
FIG. 8 is a structural diagram of a display device according to an embodiment of the present application.

An embodiment of the present application further provides a display device. FIG. 8 is a structural diagram of the display device according to the embodiment of the present application. Referring to FIG. 8, the display device 1 provided by the embodiment of the present application includes the display module 10 provided by any preceding embodiment of the present application. The display device may be a mobile phone as shown in FIG. 8 or may be a computer, a television, an intelligent wearable display device, or the like, which is not particularly limited in the embodiment of the present application.

What is claimed is:

1. A display module, comprising:

a display screen and a driver chip; wherein the display screen comprises a display region and a non-display region;

the driver chip is disposed in the non-display region of the display screen and configured to at least generate a drive signal that drives the display screen;

the driver chip comprises at least one first pin and at least one second pin, the drive signal generated by the driver chip is related to a signal transmitted by the at least one first pin, and the drive signal generated by the driver chip is unrelated to a signal transmitted by the at least one second pin;

at least one of the at least one first pin is electrically connected to at least one of the at least one second pin; and a flexible circuit board comprising:

at least one third pin and at least one fourth pin, wherein the at least one third pin is electrically connected to the at least one first pin, and the at least one fourth pin is electrically connected to the at least one second pin;

the flexible circuit board further comprises a connection line, wherein the at least one third pin is electrically connected to the at least one fourth pin through the connection line to cause the at least one first pin electrically connected to the at least one third pin to be electrically connected to the at least one second pin electrically connected to the at least one fourth pin;

the non-display region comprises a bonding region, wherein a first bonding terminal electrically connected to the at least one first pin and a second bonding terminal electrically connected to the at least one second pin are disposed in the bonding region; and the at least one third pin is electrically connected to the first bonding terminal, and the at least one fourth pin is electrically connected to the second bonding terminal.

2. The display module according to claim 1, wherein the at least one second pin is a non-enabled pin reserved on the driver chip.

3. The display module according to claim 2, wherein the at least one second pin is a pin applied to another display screen.

4. The display module according to claim 1, further comprising a connector comprising a plurality of connection ports, wherein the connection line comprises a first connection segment and a second connection segment, a first terminal of the first connection segment and a first terminal of the second connection segment are electrically connected to a same connection port among the plurality of connection ports, a second terminal of the first connection segment is electrically connected to the at least one third pin, and a second terminal of the second connection segment is electrically connected to the at least one fourth pin.

5. The display module according to claim 4, wherein a line width of the second connection segment is greater than a line width of the first connection segment.

6. The display module according to claim 4, wherein a line length of the second connection segment is less than a line length of the first connection segment.

7. The display module according to claim 1, wherein the driver chip comprises a plurality of electrostatic protection circuits, and each of the at least one first pin and the at least one second pin is connected to a corresponding electrostatic protection circuit among the plurality of electrostatic protection circuits, respectively.

8. The display module according to claim 1, wherein the non-display region comprises a bonding region, wherein third bonding terminals are disposed in the bonding region, the third bonding terminals are test pins of a display screen test circuit on the display screen, and the test pins are configured to receive test data signals when the display screen is tested; and at the least one first pin is electrically connected to at least one of the third bonding terminals.

9. The display module according to claim 8, wherein the at least one first pin is electrically connected to the third bonding terminals in a one-to-one correspondence.

10. The display module according to claim 8, wherein the display screen comprises control switches electrically connected to the test pins in a one-to-one correspondence, wherein control terminals of the control switches are electrically connected to the driver chip, first terminals of the control switches are electrically connected to the corresponding test pins, second terminals of the control switches are connected to drive signal lines in the display screen, and the driver chip is configured to control the control switches to be off when the display panel works.

11. The display module according to any claim 1, wherein the at least one first pin is disposed in a first region of the driver chip, and the at least one second pin is disposed in a second region of the driver chip.

12. The display module according to claim 11, wherein a direction of a line connecting the first region to the second region is a first direction, the first direction is perpendicular to a second direction, and the second direction is a direction of a line connecting the driver chip to the display screen.

13. The display module according to claim 11, wherein the driver chip comprises two second regions, and the first region is disposed between the two second regions.

14. The display module according to claim 1, wherein when a plurality of first pins comprises the at least one first pin are electrically connected to a plurality of second pins which comprise the at least one second pin, the plurality of second pins are electrically connected to different first pins are different.

15. The display module according to claim 1, wherein the at least one first pin is electrically connected to a plurality of second pins.

16. A display device, comprising:

a display module, comprising:

a display screen and a driver chip; wherein the display screen comprises a display region and a non-display region;

the driver chip is disposed in the non-display region of the display screen and configured to at least generate a drive signal that drives the display screen;

the driver chip comprises at least one first pin and at least one second pin, the drive signal generated by the driver chip is related to a signal transmitted by the at least one first pin, and the drive signal generated by the driver chip is unrelated to a signal transmitted by the at least one second pin;

at least one of the at least one first pin is electrically connected to at least one of the at least one second pin; and a flexible circuit board comprising:

at least one third pin and at least one fourth pin, wherein the at least one third pin is electrically connected to the at least one first pin, and the at least one fourth pin is electrically connected to the at least one second pin;

the flexible circuit board further comprises a connection line, wherein the at least one third pin is electrically connected to the at least one fourth pin through the connection line to cause the at least one first pin electrically connected to the at least one third pin to be electrically connected to the at least one second pin electrically connected to the at least one fourth pin;

the non-display region comprises a bonding region, wherein a first bonding terminal electrically connected to the at least one first pin and a second bonding terminal electrically connected to the at least one second pin are disposed in the bonding region; and the at least one third pin is electrically connected to the first bonding terminal, and the at least one fourth pin is electrically connected to the second bonding terminal.

* * * * *